United States Patent
Mellot

(10) Patent No.: US 7,627,130 B2
(45) Date of Patent: Dec. 1, 2009

(54) CIRCUIT AND METHOD FOR AUTOMATICALLY LIMITING THE AMPLITUDE OF BROADCAST AUDIO SIGNALS

(75) Inventor: Pascal Mellot, Burnham (GB)

(73) Assignee: SGS-Thomson Microelectronics Limited, Almondsbury Bristol (GB)

( * ) Notice: Subject to any disclaimer, the term of this patent is extended or adjusted under 35 U.S.C. 154(b) by 1220 days.

(21) Appl. No.: 09/047,252

(22) Filed: Mar. 24, 1998

(65) Prior Publication Data

US 2002/0057804 A1     May 16, 2002

(51) Int. Cl.
    *H03G 3/00* (2006.01)
(52) U.S. Cl. .................. 381/108; 381/104; 381/109
(58) Field of Classification Search ................ 381/56, 381/104, 106, 107, 108, 102, 101, 96, 15, 381/16, 83, 93, 55
    See application file for complete search history.

(56) References Cited

U.S. PATENT DOCUMENTS

| | | | | | |
|---|---|---|---|---|---|
| 4,404,427 | A | * | 9/1983 | Blackmer | 381/107 |
| 4,654,610 | A | * | 3/1987 | Dasilva | 333/81 R |
| 5,070,527 | A | * | 12/1991 | Lynn | 379/395 |
| 5,363,147 | A | * | 11/1994 | Joseph et al. | 348/738 |
| 5,394,476 | A | * | 2/1995 | Rollins et al. | 381/104 |
| 5,444,788 | A | * | 8/1995 | Orban | 381/106 |
| 5,528,695 | A | * | 6/1996 | Klippel | 381/55 |
| 5,533,136 | A | * | 7/1996 | Smith | 381/107 |
| 5,574,791 | A | * | 11/1996 | Orban | 381/98 |
| 5,615,256 | A | * | 3/1997 | Yamashita | 379/390 |
| 5,706,357 | A | * | 1/1998 | Yang | 381/107 |
| 5,771,301 | A | * | 6/1998 | Fuller et al. | 381/104 |
| 6,370,254 | B1 | * | 4/2002 | Gore et al. | 381/104 |

FOREIGN PATENT DOCUMENTS

GB          2 312 799          11/1997

OTHER PUBLICATIONS

"The Art of Electronics" by Paul Horowitz and Winfield Hill, Second Edition (Horowitz), p. 217.

* cited by examiner

*Primary Examiner*—Brian T. Pendleton
(74) *Attorney, Agent, or Firm*—Lisa K. Jorgenson; Daniel P. McLoughlin; Wolf, Greenfield & Sacks, P.C.

(57) ABSTRACT

A circuit for processing broadcast signals that includes circuitry for receiving and processing broadcast signals which contain audio information and providing a first audio signal, and circuitry for controlling the amplitude of a received second audio signal in response to a first control signal, and providing a third audio signal wherein the circuit further comprises circuitry that receives the first audio signal and provides the second audio signal for automatically limiting the amplitude of the first audio signal in response to at least one reference signal.

19 Claims, 4 Drawing Sheets

CIRCUIT AND METHOD FOR AUTOMATICALLY LIMITING THE AMPLITUDE OF BROADCAST AUDIO SIGNALS

BACKGROUND OF THE INVENTION

1. Field of the Invention

The present invention relates to the automatic limiting of signals. More particularly, the present invention relates to a circuit and method for automatically limiting the amplitudes of broadcast and/or transmitted audio signals.

2. Background Art

The following figures which illustrate the various embodiments of the background art and the present invention may incorporate the same or similar elements. Therefore, where the same or similar elements occur throughout the various figures, they will be designated in the same manner.

FIG. 1 illustrates a block diagram of a known circuit for varying the amplitude of audio signals.

This figure comprises a receiving circuitry 100 and output circuitry 110 and is applicable to an analogue and/or digital system.

The receiving circuitry 100 and output circuitry could for example be the respective audio front and back ends in a radio, television, video, satellite decoder etc.

The receiving circuitry 100 receives, via an input 120, a transmitted or broadcast signal Si. The circuitry 100 then processes the signal Si and outputs, via its output 130, a first audio, i.e. sound, signal A1.

The input 140 of the output circuitry 110 is connected to the output 130 of the receiving circuitry 100 and thus the output circuitry 110 receives the signal A1. The output circuitry 110 then processes the signal A1 and outputs, via its output 150, a second audio signal A2, which is then fed to a speaker system (not illustrated).

The output circuitry 110 also receives a control signal C1 via another input 160. This control signal C1 is controlled by the user of the apparatus in which this circuitry of FIG. 1 is utilised. This signal C1 is used to control the peak, average and/or Root Mean Square (RMS) amplitude of the audio signal A2. Therefore, by increasing, for example, the RMS amplitude of the audio signal A2, the volume of the signal from the speakers is increased and vice-versa. The user can control the signal C1 by, for example, a knob or button on said apparatus or by a remote control system that works in conjunction with said apparatus.

One problem associated with the arrangement of FIG. 1 is that if there is a change in the RMS amplitude of the signal A1, then this will be proportionally reflected in the signal A2 and hence the volume. The effect of this is that the user will have to readjust the control signal C1 to return the volume emanating from the speakers, i.e. the RMS amplitude of the signal A2, to substantially the same level as before the change in the RMS amplitude of the signal A1.

An example of where changes in the RMS amplitude of the signal A1 occur are in the commercial breaks of television, satellite and radio broadcasts. During these commercial breaks quite often the amplitude of the broadcast audio signal is increased, which results in an increased volume output. The purpose underlying this increase is to stimulate the listener and draw his attention to the commercial and hence the product, service etc. being advertised. However, the increase in the level of the volume can be as much as +6 dB for example, i.e. double the amplitude of the original signal, which results in the listener diving for the control knob/button or scrabbling for the remote control device in order to reduce the volume. Then when the commercial is over, the listener has to readjust the volume back to the acceptable level it was before the commercial.

Another example of where sudden changes in the amplitude of the signal A1 occurs is during the tuning of a radio. The strengths, i.e. the amplitudes, of some signals are greater than others and it can be quite disturbing, and in some instances dangerous, when there is a sudden increase in the output volume: this is especially the case if one is tuning a car radio when driving for example.

OBJECTS & SUMMARY OF THE INVENTION

Accordingly, an object of the present invention is to automatically compensate for variations, whether deliberate or otherwise, in the signals of audio systems and apparatus.

Another object of the present invention is to automatically maintain the amplitudes of signals within audio systems and apparatus to substantially a fixed level or substantially within a range of one or more levels.

In order to achieve these objects, the present invention proposes a circuit for processing broadcasted/transmitted signals that comprises: circuitry for receiving and processing the broadcast signals, which contain audio information, and providing a first audio signal; and circuitry for controlling, i.e. adjusting, the amplitude, i.e. the volume, of a received second audio signal in response to a first control signal and providing a third audio signal. The circuit further comprises circuitry, that receives the first audio signal and provides the second audio signal, for automatically limiting or adjusting the amplitude of the first audio signal in response to at least one reference signal.

According to another embodiment of the present invention, the circuitry for automatically limiting or adjusting the amplitude of the first audio signal comprises: circuitry, that receives the second audio signal, for providing an output signal in response to the amplitude of the second signal; circuitry for comparing the output signal and said at least one reference signal and providing a second control signal in response to the output signal and said at least one reference signal; and circuitry, that receives the first audio signal and that is controlled in response to the second control signal, for providing the second audio signal.

According to another embodiment of he present invention, the circuitry for providing: the output signal; the second control signal; and for providing the second audio signal are implemented by analogue and/or digital means.

According to another embodiment of the present invention, the circuitry for providing: the output signal; the second control signal; and for providing the second audio signal are implemented by hardware digital circuitry.

According to another embodiment of the present invention, the digital means can be represented by one or more digital signal processing algorithms and/or by one or more software routines.

According to another embodiment of the present invention, the digital means is implemented by any combination of hardware digital circuitry, one or more digital signal processing algorithms, and one or more software routines.

According to another embodiment of the present invention, the circuitry for providing: the output signal is a Root-Mean Square extractor circuitry; the second control signal is an integrating comparator; and the circuitry for providing the second audio signal is an attenuator.

According to another embodiment of the present invention, the Root-Mean Square extractor circuitry comprises a series connected rectifier and low pass filter.

According to another embodiment of the present invention, the circuitry for providing the second control signal comprises a current sourcing/sinking comparator having a capacitor connected between its output terminal and a reference voltage, i.e. ground potential for example.

According to another embodiment of the present invention, the circuitry for providing the second audio signal is a multiplying digital-to-analogue converter.

According to another embodiment of the present invention, the circuit is included in an apparatus that receives broadcast and/or transmitted signals.

According to other embodiments of the present invention, the circuit is included in circuitry and/or an apparatus that receives television, satellite, and/or radio signals.

The present invention also proposes a method for processing broadcast or transmitted signals that comprises the steps of: receiving and processing the broadcast or transmitted signals, which contain audio information, and providing a first audio signal; and controlling the amplitude of a received second audio signal in response to a first control signal and providing a third audio signal. The method further comprises the step of automatically limiting, i.e. adjusting, the amplitude of the first audio signal in response to at least one reference signal and providing a second audio signal.

According to another embodiment of the present invention, the step of automatically limiting the amplitude of the first audio signal comprises: providing an output signal in response to the amplitude of the second signal; comparing the output signal and said at least one reference signal and providing a second control signal in response to the output signal and said at least one reference signal; and receiving the first audio signal and controlling said first audio signal in response to the second control signal, for providing the second audio signal.

According to another embodiment of the present invention, the method is practiced in circuitry and/or an apparatus that receives television, satellite and/or radio signals.

BRIEF DESCRIPTION OF THE DRAWINGS

These and other objects, as well as other advantages and features, of the present invention will become apparent in light of the following detailed description and accompanying drawings among which.

DETAILED DESCRIPTION OF THE INVENTION

Figure 2:
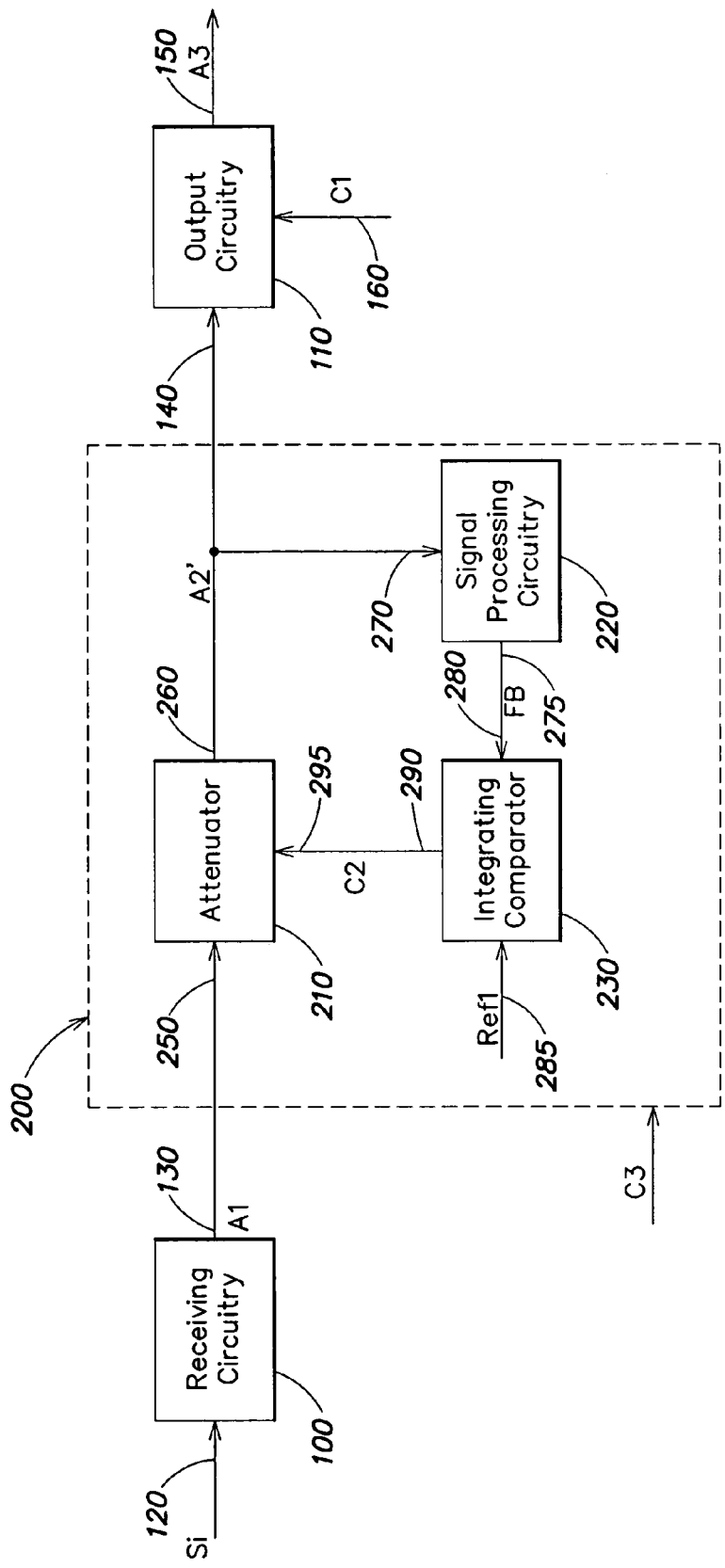
FIG. 2 illustrates a block diagram of a circuit for automatically limiting the amplitude of audio signals according to the present invention.

FIG. 2 illustrates a block diagram of a circuit for automatically limiting the amplitude of audio signals according to the present invention.

Figure 1:
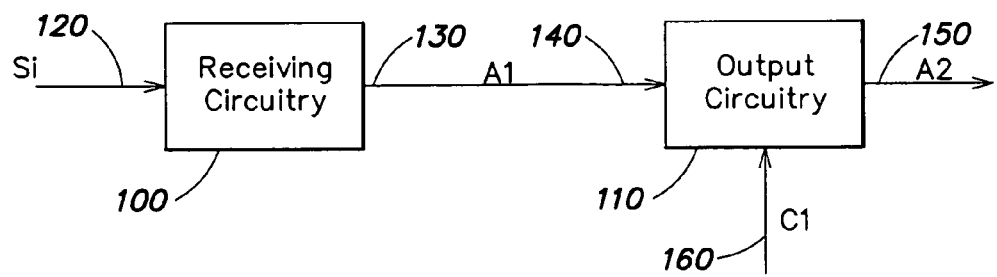
FIG. 1 has already been depicted as exposing the state of art and the problem to overcome.

In addition to the circuitry 100 and 110 of FIG. 1, FIG. 2 also includes circuitry 200 for automatically limiting or adjusting the amplitude of the audio signal A1 in response to at least one reference signal Ref1. This reference signal Ref1 may be pre-defined during the design phase and/or may or may not be adjustable afterwards.

Since the circuitry 100 and 110 of FIG. 1 has already been described, Its operation will hereafter be omitted for the purposes of brevity.

According to the present invention, the circuitry 200 comprises: an attenuator 210, signal processing circuitry 220, and an integrating comparator 230.

A first input 250 of the attenuator 210, which according to the present invention is preferably variable, is connected to the output 130 of the circuitry 100 and receives the signal A1. The output 260 of the attenuator 210, which carries a second audio signal A2', is connected to the respective inputs 140 and 270 of the respective circuitry 110 and 220. The output 275 of the circuitry 220, which carries a feedback signal FB that is derived from the audio signal A2', is connected to a first input 280 of the integrating comparator 230. The second input 285 of the integrating comparator 230 receives the reference signal Ref1. The output 290 of the integrating comparator 230, which carries a second control signal C2, is connected to a second input 295 of the attenuator 210.

According to the present invention, a purpose of the attenuator 210, the signal processing circuitry 220, and integrating comparator 230 is to limit the amplitude of the audio signal A2', in response to the reference signal Ref1, to a desired threshold, by automatically compensating for variations beyond said threshold of the amplitude of the signal A1. According to the present invention it is preferable to limit the RMS amplitude, however the present invention can be used to limit the average or peak amplitude of the signal A1.

By way of an example of the operation of the circuit according to the present invention consider the following, which is applicable to television, satellite and radio transmitted broadcasts.

The attenuator 210, which could be a network or transducer, is controlled by control signal C2, which is in turn controlled by the signals Ref1 and FB. Assume that, during 'normal' broadcast, i.e. when the RMS amplitude of the broadcast audio signal is not deliberately increased, the signals Ref1 and FB are at values such that the attenuator 210 provides substantially 0 dB's of attenuation: therefore the RMS value of the audio signal A2 substantially equals that of A1. The user controls the output volume from the speakers, i.e. the RMS amplitude of the audio signal A3 that appears on the output 150 of the circuitry 110, to its desired level by altering the control signal C1, which has the effect of either amplifying or attenuating the signal A2' within the circuitry 110. Assume now that the broadcast is not 'normal', i.e. the RMS amplitude of the broadcast audio signal has been deliberately increased by +6 dB for example. According to the present invention, an object of the processing circuitry 220 and the integrating comparator 230 is to stimulate the attenuator 210 such that it attenuates the signal A1, preferably by the same amount that it was amplified by. Initially, since the attenuator provides an attenuation of 0 dB, the signal A2' has substantially the same RMS amplitude as A1. The increase in the amplitude of signal A2' is detected by the processing circuitry 220, whose output signal FB changes as a result of this increase. Assume for example that the FB is a voltage signal that increases from a value V1 to a value V2. Also assume that the reference signal Ref1 supplied to the integrating comparator 230 is a voltage signal that has a value V3, which is slightly greater than V1, so as to allow for minor increases in the signal FB, but less than V2. As the signal FB increases from V1 to V2 it triggers the comparator 230 so that the control signal C2 stimulates the attenuator such that its attenuation of the signal A1 changes rom 0 dB to −6 dB, thereby restoring the level of the signal A2' to substantially its previous value. It should be noted that the response time for the circuitry 200 to attenuate the amplified signal A1 will be such that the user will not notice any appreciable change in the output volume of the apparatus.

In a system where the increase in the signal A1 during a not 'normal' broadcast is fixed: not 'normal' in the sense that the broadcast audio signal in purposely increased; it is sufficient enough to fix the amount of attenuation provided by the attenuator 210 so that the attenuator 210 can just be switched on when attenuation is needed and vice-versa.

However, according to the present invention, it is preferable to be able to have variable attenuation that is controllable so as to be able to attenuate the signal A1 by the same amount that it was amplified. As an example, assume A1 is increased by only +3 dB, as opposed to +6 dB, then it is preferable that the attenuator 210 attenuates it by −3 db and so forth.

It should be noted that, according to the present invention, it is preferable that the user should have the option to be able to control whether or not attenuation during advertising actually takes place or not. The user can therefore control, using control signal C3, whether or not the circuitry 200, or any part of it, operates such that it provides the necessary attenuation, or not as the case may be, during the advertising breaks. The user may control this attenuation function with a switch or button or the like, or alternatively, via a remote control apparatus with, in the case of a television or monitor, an On Screen Display (OSD) facility for example.

According to the present invention, it is preferable to design a multi-standard system especially for television, video, satellite applications etc. This is easily achieved with the aid of a microcontroller or microprocessor and some memory (not illustrated). The memory can De pre-programmed with various information about the peak, average and/or RMS values of the broadcast signals and even standards throughout the various countries of the world. The correct settings can easily be called up during the assembly and testing phases of the apparatus. The attenuator can then be controlled directly by, or in conjunction with, the microcontroller/microprocessor so that it provides the correct attenuation as and when it is required.

Figure 3:
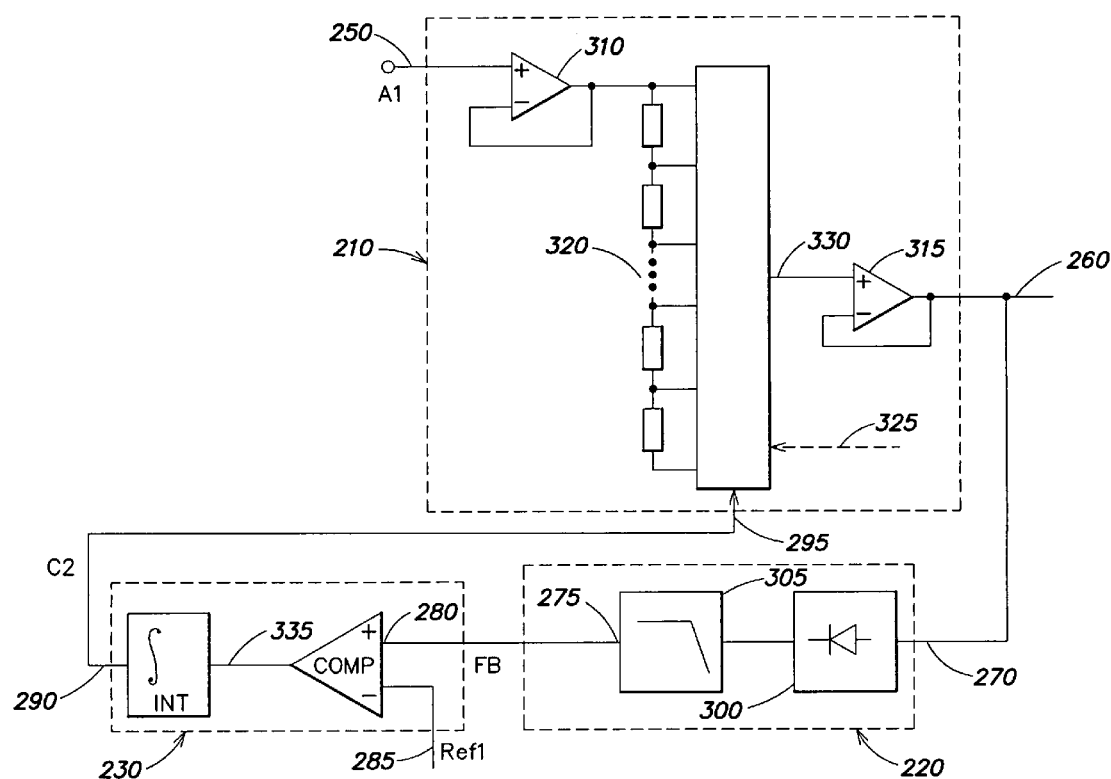
FIG. 3 illustrates an example of a circuit diagram for automatically limiting the amplitude of an audio signal according to the present invention.

FIG. 3 illustrates an example of a circuit diagram for automatically limiting the amplitude of an audio signal according to the present invention.

The circuitry 200 of FIG. 2 is illustrated in further detail in this present figure. The attenuator 210 comprises a multiplying digital-to-analogue (D/A) converter; the processing circuitry 220 a rectifier 300 and low pass filter 305; and the integrating comparator comprises a comparator COMP and an integrator INT.

The multiplying D/A comprises two voltage followers 310, 315 and a switched resistive attenuation control circuit 320. The signal A1 is applied to the control circuit 320 after having been buffered by the voltage follower 310. The control circuit 320 receives the control signal C2 from the comparator 230. The control circuit 320 can be controlled by a microprocessor or microcontroller (not illustrated), as indicated by the dashed input 325. This control input 325 can be used to actively adjust the amount of attenuation provided by the control circuitry 320 in response to predetermined references for example. The signal A2 is derived from the output 330 of the circuit 320 via the voltage follower 315.

The rectifier 300 recifies the signal A2' before it is passed through the low pass filter 305. The resulting output signal FB from the filter 305 is the Root-Mean Square (RMS) value of the signal A2'.

The signal FB is compared with the reference signal Ref1, so that for example., when FB is greater than Ref1, the output signal C2 from the integrating comparator 230 is a positive ramp, which is used to control the circuit 320.

FIGS. 4a–4f illustrate waveforms associated with the circuitry of FIG. 3.

Figure 4A:
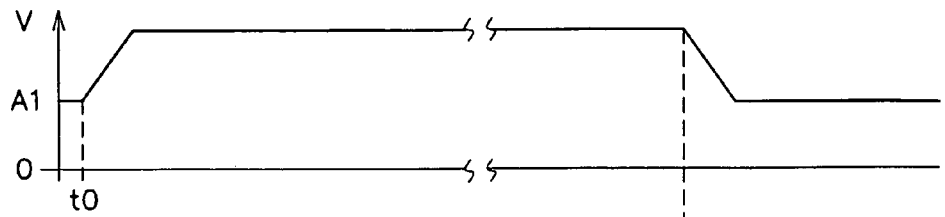
FIGS. 4a–4f illustrate waveforms associated with the circuitry of FIG. 3.

It should be noted that the following figures are not to scale and are representations of the underlying principles and that the waveform of FIG. 4a only illustrates the positive envelope of a broadcast signal.

Figure 4B:
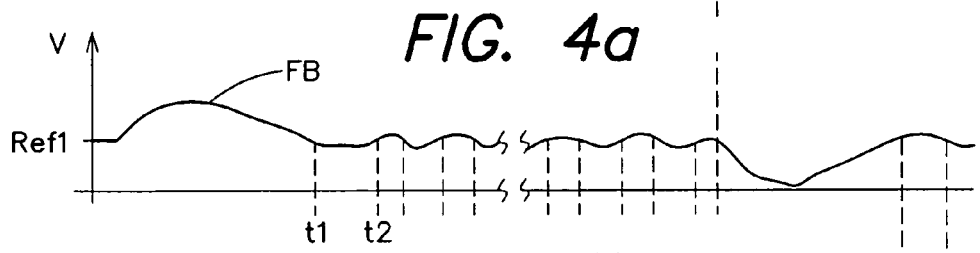
Figure 4C:
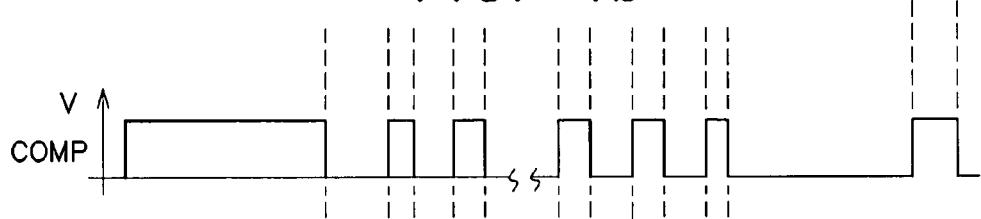
Figure 4D:
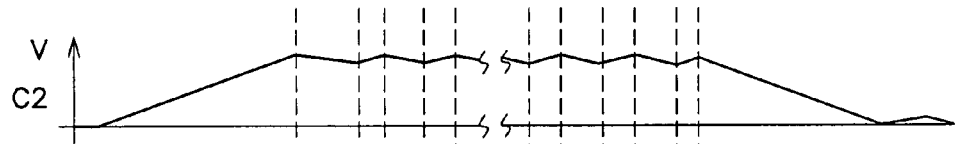
Figure 4E:
Figure 4F:
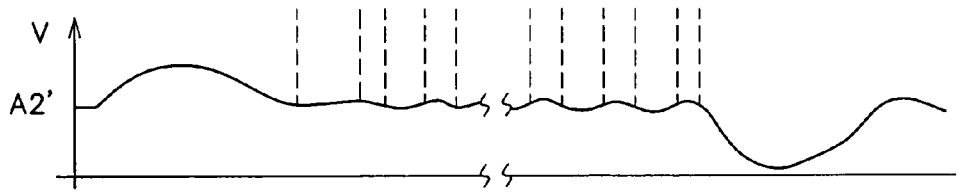

When the signal A1 increases, at time t0, from its 'normal' value to its increased value, as illustrated in FIG. 4a, this causes the value of the signal FB to start to increase, as illustrated in FIG. 4b. When the voltage value of the signal FB becomes greater than approximately that of the reference voltage Ref1, the comparator's output 335, in this particular example, changes to a high state, as illustrated in FIG. 4c. The resulting output signal C2 from the integrator, which can be implemented by a capacitor (not illustrated) for example, is a positively increasing ramp. The signal C2 acts upon the attenuation control circuit 320 such that it attenuates the signal A1, as can be seen by the resultant attenuated signal A2' illustrated in FIG. 4f. Naturally, the attenuation of the signal A1 to produce the attenuated signal A2' results in an attenuation of the signal FB When the signal A1 has beer attenuated by the attenuation control circuit 320 such that the value of FB equals that of Ref1, then the output of the comparator COMP reduces to its low state, as illustrated at time t1 in FIG. 4b.

As a result of the comparator returning to its low state, the output signal C2 starts to reduce, which reduces the attenuation of the signal A1, which in turn increases the RMS value of the signal A2'. Therefore, the signal FB increases such that it becomes greater than approximately Ref1, as illustrated at time t2 in FIG. 4b. This in turn causes the output from the comparator COMP to change to a high state, that in turn causes the signal C2 to increase, which in turn causes the attenuator 210 to increase the attenuation of the signal A1 and so on.

Therefore, he attenuation oscillates about its mean value, of say −6 dB for example. However, the circuit can be designed such that the oscillations or adjustments made to the attenuation are not prone to detection by the listener. One way of achieving this is to have relatively long time constants associated with the charging and discharging of the integrator INT. However, these time constants are such that the listener would neither detect any substantial difference in the output volume when the there is an increase/decrease in the signal A1 or the oscillations in the signal A2'.

FIG. 3 is just one example of how to automatically compensate for variations in the amplitude of an audio signal. The same can be achieved whether the system is analogue and/or digital. The implementation of the basic block diagram of FIG. 2 can be either: analogue; and/or digital, either hardware and/or by means of one or more Digital Signal Processing (DSP) algorithms and/or one or more software routines. These types of solutions will be known to those skilled in the art.

Although this invention has been described in connection with certain preferred embodiments, it should be understood that the present disclosure is to be considered as an exemplification of the principles of the invention and that there is no intention of limiting the invention to the disclosed embodiments. On the contrary, it is intended that all alternatives, modifications and equivalent arrangements as may be included within the spirit and scope of the appended claims be covered as part of this invention.

The invention claimed is:

1. A circuit for processing broadcast signals, comprising:
   first circuitry for receiving a broadcast signal and processing the broadcast signal to extract and output a first audio signal;
   an attenuator for receiving the first audio signal and attenuating the first audio signal based upon a first control signal to generate a second audio signal;
   second circuitry for receiving the second audio signal and one of attenuating and amplifying the second audio signal based upon a second control signal to generate a third audio signal; and
   feedback circuitry for generating the first control signal based upon the second audio signal, the feedback circuitry including
      third circuitry for receiving the second audio signal and determining a Root Mean Square (RMS) value of the second audio signal and providing an output signal based upon the RMS value, and
      a comparator for receiving the output signal and comparing the output signal with at least one reference signal to generate the first control signal.

2. A circuit according to claim 1, wherein the attenuator, the comparator, and the third circuitry are implemented by analog and/or digital circuitry.

3. A circuit according to claim 1, wherein the attenuator, the comparator, and the third circuitry are implemented by hardware digital circuitry.

4. A circuit according to claim 2, wherein the digital circuitry is represented by one or more digital signal processing algorithms and/or by one or more software routines.

5. A circuit according to claim 4, wherein the digital circuitry is implemented by any combination of hardware digital circuitry, one or more digital signal processing algorithms, and one or more software routines.

6. A circuit according to claim 1, wherein the third circuitry is a Root-Mean Square extractor circuitry and the comparator is an integrating comparator.

7. A circuit according to claim 6, wherein the Root-Mean Square extractor circuitry comprises a series connected rectifier and low pass filter.

8. A circuit according to claim 6, wherein the integrating comparator includes a current sourcing/sinking comparator.

9. A circuit according to claim 6, wherein the attenuator includes a multiplying digital-to-analog converter.

10. A circuit according to claim 1, further comprising an apparatus that receives television signals.

11. A circuit according to claim 10, wherein said apparatus is a television.

12. A circuit according to claim 1, further comprising an apparatus that receives satellite signals.

13. A circuit according to claim 12, wherein said apparatus is a satellite decoder.

14. A circuit according to claim 1, further comprising an apparatus that receives radio signals.

15. A circuit according to claim 14, wherein said apparatus is a radio.

16. A method for processing broadcast signals comprising the steps of:
   receiving a broadcast signal and processing the broadcast signal to extract and output a first audio signal;
   attenuating the first audio signal to generate a second audio signal based upon a first feedback control signal; and
   one of attenuating and amplifying the second audio signal based upon a second control signal to generate a third audio signal;
   wherein the step of attenuating the first audio signal includes
      determining a Root Mean Square (RMS) value of the second audio signal and providing an output signal that is based upon the RMS value, and
      comparing the output signal with at least one reference signal to generate the first feedback control signal.

17. A method according to claim 16, wherein the method is implemented in an apparatus that receives television signals.

18. A method according to claim 16, wherein the method is implemented in an apparatus that receives satellite signals.

19. A method according to claim 16, wherein the method is implemented in an apparatus that receives radio signals.

* * * * *

UNITED STATES PATENT AND TRADEMARK OFFICE
CERTIFICATE OF CORRECTION

| | | |
|---|---|---|
| PATENT NO. | : 7,627,130 B2 | Page 1 of 1 |
| APPLICATION NO. | : 09/047252 | |
| DATED | : December 1, 2009 | |
| INVENTOR(S) | : Pascal Mellott | |

It is certified that error appears in the above-identified patent and that said Letters Patent is hereby corrected as shown below:

Delete Col. 5 line 62 and insert
--The rectifier 300 rectifies the signal A2' before it is passed--

Signed and Sealed this

Twenty-sixth Day of January, 2010

David J. Kappos
*Director of the United States Patent and Trademark Office*